United States Patent
Brambilla et al.

[19]

[11] Patent Number: 5,623,254
[45] Date of Patent: Apr. 22, 1997

[54] DRIVE CIRCUIT FAULT DETECTION DRIVE

[75] Inventors: Massimiliano Brambilla, Sesto San Giovanni; Giampietro Maggioni, Cornaredo, both of Italy

[73] Assignee: SGS-Thomson Microelectronics S.r.l., Agrate Brianza, Italy

[21] Appl. No.: 367,746

[22] Filed: Jan. 3, 1995

Related U.S. Application Data

[63] Continuation of Ser. No. 922,019, Jul. 29, 1992, abandoned.

[30] Foreign Application Priority Data

Jul. 31, 1991 [IT] Italy ................................. TO91A0609

[51] Int. Cl.⁶ ................................................. B60Q 1/00
[52] U.S. Cl. .................... 340/644; 340/635; 340/638; 340/654; 361/93; 361/101; 364/483
[58] Field of Search ................................. 340/635, 638, 340/639, 644, 654, 642; 361/101, 93; 364/483

[56] References Cited

U.S. PATENT DOCUMENTS

| | | | |
|---|---|---|---|
| 4,420,784 | 12/1983 | Chen et al. | 361/7 |
| 4,574,266 | 3/1986 | Valentine | 340/642 X |
| 4,736,267 | 4/1988 | Karlman et al. | |
| 4,750,079 | 6/1988 | Fay et al. | |
| 5,142,432 | 8/1992 | Schneider | 361/91 |
| 5,153,809 | 10/1992 | Murakami | 361/93 |

FOREIGN PATENT DOCUMENTS

| | | |
|---|---|---|
| A-0128574 | 12/1984 | European Pat. Off. |
| A-0418665 | 3/1991 | European Pat. Off. |
| A-4035571 | 11/1990 | Germany |

OTHER PUBLICATIONS

Patent Abstracts of Japan, vol. 10, No. 316 (P–510) Oct. 28, 1986 & JP–A–61 127 010 (Mitsubishi Electric Corp.) Jun. 14, 1986.

*Primary Examiner*—Jeffery Hofsass
*Assistant Examiner*—Edward Lefkowitz
*Attorney, Agent, or Firm*—David M. Driscoll; James H. Morris

[57] ABSTRACT

A drive circuit fault detection device comprising a discriminating circuit generating a digital signal, the level of which indicates a fault; and an identifying circuit generating a binary-coded signal indicating the type of fault, i.e. ground shorting of the drive circuit or an open load. The discriminating circuit comprises a resistive network connected to the output of the drive circuit, for generating a voltage indicating correct connection of the load or a fault on the drive circuit and a comparator for comparing the generated voltage with a reference voltage and supplying the digital signal at its output. The identifying circuit comprises a current mirror circuit generating an output voltage having two different logic levels in the event of short circuiting or an open load, respectively, and a combination circuit for generating the binary-coded output signal.

11 Claims, 1 Drawing Sheet

DRIVE CIRCUIT FAULT DETECTION DRIVE

This application is a continuation of application Ser. No. 07/922,019, filed Jul. 29, 1992, now abandoned.

BACKGROUND OF THE INVENTION

1. Field of the Invention

The present invention relates to a drive circuit fault detection device, in particular, for output short circuiting or disconnected load detection.

2. Discussion of the Related Art

In the following description, reference will be made to a so-called low-side-driver circuit, i.e. wherein the drive circuit is grounded and the load connected to a positive supply, thus requiring detection of ground shorting of the circuit output. The present invention, however, is equally applicable to so-called high-side-driver circuits.

FIG. 1 shows the overall structure of a prior art low-side-driver circuit, wherein drive circuit 1 is shown schematically by its control element, including a power transistor 2 having a first (control) terminal 3 receiving a control signal (IN); a second terminal 4 connected to positive supply line $V_{CC}$ via load 5; and a third terminal 6 grounded via resistor 7. Terminal 4 of transistor 2 also supplies the drive circuit output.

In the above known circuit, ground shorting of output 4, as shown schematically by dotted line 8, is detected by monitoring the current in the control element, normally by means of a sensing resistor frequently implemented by resistor 7 itself, shorting being indicated by failure of said current to reach a given value within a given length of time.

A major drawback of the above known solution is that it entails defining beforehand a short-circuit resistance which, to ensure correct detection, must be considerably less than the equivalent resistance of control element 2.

It is an object of the present invention to provide a fault (specifically, ground shorting) detection device, which, by virtue of not requiring a predefined short-circuit resistance, does not entail detecting or monitoring the current in the control element.

SUMMARY OF THE INVENTION

The present invention provides a fault detection device for a drive circuit having an output connected to a load comprising a fault discriminating circuit having an input coupled to the output of the drive circuit and an output providing a digital signal indicative of a condition of a connection between the drive circuit and the load, the fault discriminating circuit comprising a detector for determining when a fault exists in the connection between the drive circuit and the load. The invention further includes a fault identification circuit, coupled to the output of the fault discriminating circuit, including circuitry responsive to the digital signal provided by the fault discriminating circuit for providing a signal indicative of a type of fault detected by the fault discriminating circuit. The fault identification circuit further includes a combinatorial circuit generating a binary-coded output signal having a first state when the drive circuit and the load are connected, a second state when the output of the drive circuit is short-circuited, and a third state when the drive circuit and the load are disconnected.

BRIEF DESCRIPTION OF THE DRAWINGS

A preferred, non-limiting embodiment of the present invention will be described with reference to the accompanying drawings, in which:

The drive circuit components common to both FIGS. 1 and 2 are shown using the same reference characters.

As shown in FIG. 2, the fault detection device according to the present invention comprises a fault discriminating circuit 10 for generating a predetermined (e.g. high) logic output signal in the presence of a fault (shorting of output 4 of drive circuit 1, or disconnected load 5); and a fault identifying circuit 12 for identifying the type of fault involved.

Figure 2:
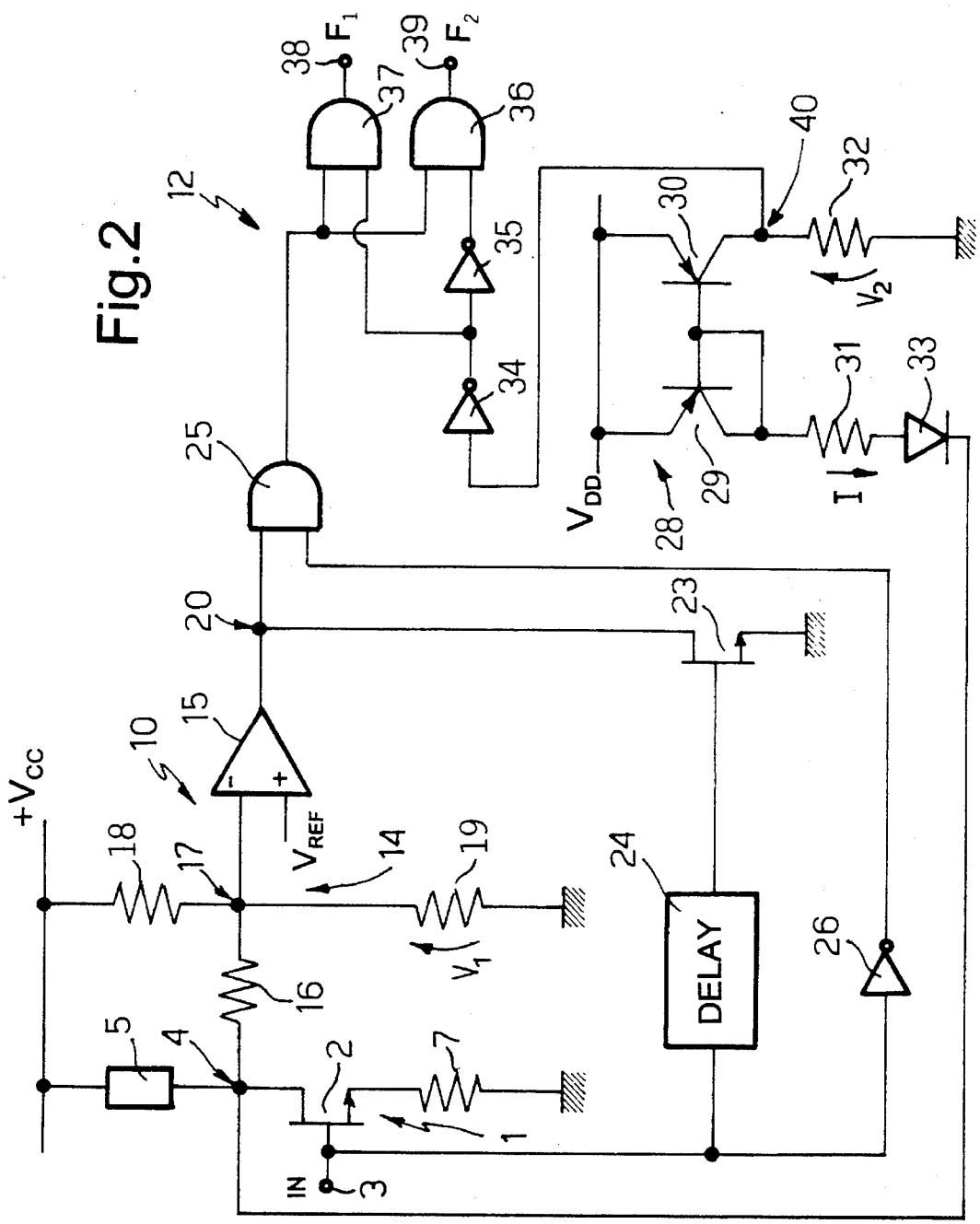
FIG. 2 shows a simplified schematic diagram of one embodiment of the device according to the present invention.
Figure 1:
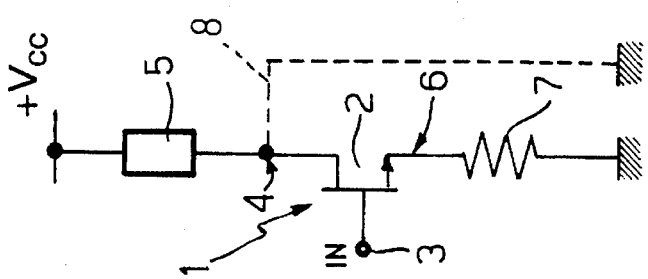
FIG. 1 shows a simplified schematic diagram of a prior art drive circuit to which the present invention is applied.

More specifically, discriminating circuit 10 comprises voltage generating means 14 connected to output 4 of drive circuit 1, for generating different voltage levels depending on the presence or absence of a fault between output 4 and load 5; and a comparator 15 for comparing said voltage level with a reference voltage, and generating a digital fault output signal. Voltage generating means 14 in turn includes a resistive network 14 comprising a first resistor 16 having a first terminal connected to output 4 of circuit 1, and a second terminal connected to mid point 17 of a voltage divider. The voltage divider in turn includes a second resistor 18 connected between mid point 17 and supply line $V_{CC}$ (first reference potential line); and a third resistor 19 connected between mid point 17 and ground (second reference potential line). Comparator 15 has its inverting input (−) connected to mid point 17, and its non-inverting input (+) connected to a reference voltage obtainable in a known manner from the supply voltage via a further voltage divider. Output 20 of comparator 15 also supplies the output of discriminating circuit 10.

Output 20 is connected to the drain terminal of an FET transistor 23, which acts as a switch for selectively grounding output 20, for which purpose, the source terminal of transistor 23 is grounded, and the gate terminal connected to the output of a delay circuit 24. The input of delay circuit 24 is connected to control terminal 3 of transistor 2.

Output 20 is connected to one input of a two-input AND circuit 25, the other input of which is connected to control terminal 3 via an inverter 26, so that the signal at output 20 (possibly after a given delay set by means of circuit 24) is only supplied to identifying circuit 12 in the absence of control signal IN (i.e. when the drive circuit is disabled).

Identifying circuit 12 comprises a current mirror circuit 28 including first and second PNP transistors 29, 30 having emitter terminals respectively connected to a second supply line $V_{DD}$ generally differing from the first $V_{CC}$; mutually connected base terminals; and collector terminals connected to respective resistors 31 and 32. Transistor 29 is also diode-connected, i.e., its base and collector terminals are connected together. Resistor 31 is connected between the collector of transistor 29 and the anode of a diode 33. The cathode of diode 33 is connected to output 4 of drive circuit 1; while resistor 32 is connected between the collector of transistor 30 and ground. The collector of transistor 30, which controls the output of mirror circuit 28 at terminal 40 is also connected to one input of a two-input AND circuit 36 via the cascade connection of two inverters 34, 35; while the mid point of inverters 34, 35 is connected to one input of a further two-input AND circuit 37. The second input of both AND circuits 36, 37 is connected to the output of circuit 25. Respective outputs 38, 39 of circuits 37, 36 constitute the outputs of the detection device respectively supplying signals F1, F2, which together define a binary signal.

The FIG. 2 device operates as follows. If R1, R2 and R3 are the respective resistances of components 18, 19 and 16, and assuming, for the sake of simplicity, a negligible resistance of load 5 (as is usually the case with inductive loads such as internal combustion engine injectors or solenoids having a resistance of a few Ohms), the voltage $V_1$ at point 17 equals:

$$V_{1a} = V_{CC} * \frac{R2}{R2 + R1//R3}$$

if the load is connected;

$$V_{1b} = V_{CC} * \frac{R2}{R1 + R2}$$

if the load is disconnected (open); and $$V_{1c} = V_{CC} * \frac{R2//R3}{R1 + R2//R3}$$

in the event of a short circuit between output 4 and ground.

By appropriately choosing the values of the resistors, therefore, it is possible to distinguish between a connected load and fault situations. More specifically, as voltage $V_1$ is at a maximum when the load is connected, by selecting a reference voltage $V_{REF}$ of comparator 15 slightly lower than $V_{1a}$, but higher than $V_{1b}$ and $V_{1c}$, output 20 of the comparator will be low when the load is connected, and high in the event of a fault.

By way of example, suitable resistance values for components 16, 18 and 19 may be:

R1=30 KΩ
R2=60 KΩ
R3=1 KΩ

With these values and a supply voltage $V_{CC}$=16 V:

$V_{1a}$=15.75 V
$V_{1b}$=10.67 V
$V_{1c}$=508 mV so that any faults may safely be determined with a reference voltage $V_{REF}$ between 15 and 10 V.

To prevent false alarm signals during operation of drive circuit 1 (the low resistance of which would prevent normal operation from being distinguished from a fault situation), the output signal from comparator 15 can only be supplied to identifying circuit 12 when circuit 1 is disabled (low-level of control signal IN) and, consequently, circuit 25 enabled. Also, to allow output 4 of circuit 1 to settle, circuit 24 provides for delaying the reading of comparator 15 following switching of control signal IN. In fact, when control signal IN switches low, delay circuit 24 supplies an output pulse for turning on transistor 23 and so grounding output 20 regardless of the value of voltage $V_1$, so that the output of circuit 25 is low. At the end of the pulse generated by delay circuit 24, transistor 23 goes off, thus enabling the output of comparator 15 to switch to the logic state corresponding to the level of voltage $V_1$, so that the output of circuit 25 presents a high signal in the event of a fault, or a low signal if the load is connected.

The type of fault is distinguished by means of circuit 12. In the event of a short circuit at output 4, the cathode of diode 33 is grounded, and the reference branch consisting of components 29, 31 and 33 of mirror circuit 28 presents a current I of:

$$I = (V_{DD} - 2V_{BE})/R4$$

where $V_{BE}$ is the base-emitter voltage drop of transistor 29 and diode 33, and R4 the resistance of resistor 31. The above current is mirrored in the branch consisting of components 30 and 32, and, in resistor 32, produces a voltage drop $V_2$ of:

$$V_2 = R5*(V_{DD} - 2V_{BE})/R4$$

where R5 is the resistance of resistor 32. Thus, by appropriately choosing the values of resistors R4 and R5 (e.g. both of the same value), it is possible to obtain a high logic level voltage $V_2$ at output terminal 40.

Conversely, in the event load 5 is disconnected (open), resistors 16 and 18 of the discriminating circuit produce a high voltage at output 4 (pull-up situation) which disables mirror circuit 28 and produces a zero voltage in resistor 32 (low logic level $V_2$ voltage signal at output 40). Finally, diode 33 also provides for disconnecting identifying circuit 12 if load 5 is connected during operation of drive circuit 1, to prevent it from interfering with normal operation of the drive circuit. The combination circuit consisting of components 34–37 thus provides for distinguishing between the various situations involved.

More specifically, if F1 and F2 are the signals at outputs 38 and 39:

| F1 | F2 | Situation |
|----|----|-----------|
| 0 | 0 | connected load |
| 0 | 1 | open load |
| 1 | 0 | ground short circuit |
| 1 | 1 | not permitted |

The above signals may thus be supplied to downstream circuits for generating specific signals or commands.

The advantages of the FIG. 2 device are clear from the foregoing description. In particular, it does not entail a predefined short circuit resistance, which, even if present, has substantially no effect on the parallel connection of resistors 16 and 19; it provides for a wider range of diagnostic functions by also detecting open-load situations; it is straightforward in design, can be implemented easily and even fully integrated, thus providing for low-cost manufacture and a high degree of reliability; and it does not interfere with normal operation of, or require alterations to, drive circuit 1, since it is connected directly to output 4.

To those skilled in the art it will be clear that changes may be made to the device as described and illustrated herein without, however, departing from the scope of the present invention. In particular, the discriminating circuit may consist of nonresistive elements, providing they supply a voltage indicating a fault (short circuit or open load) on the drive circuit-load connection; and the identifying circuit may comprise, for example, a pair of comparators with different references connected to the resistive network.

We claim:

1. A fault detection device for a drive circuit having a control terminal that receives a control signal, an output terminal capable of establishing a connection to a load, and a third terminal coupled to a ground reference, the fault detection device comprising:

a fault discriminating circuit that determines whether a fault exists in the connection between the drive circuit and the load, the fault discriminating circuit having:

an input coupled to the output terminal of the drive circuit, and an output providing a condition signal indicative of a condition of the connection between the drive circuit and the load when the drive circuit is disabled to prevent current from passing through the drive circuit;

a voltage generator for generating a voltage representing the condition of the connection between the drive circuit and the load;

a comparator, coupled to and responsive to the voltage generated by the voltage generator, that compares the voltage generated by the voltage generator with a reference voltage and that provides the output signal, at least a portion of the voltage generator and the comparator forming a short-to-ground detector that detects a short circuit between the output terminal and the ground reference; and an AND circuit having a first input responsive to the output signal of the comparator, a second input, responsive to the drive circuit control signal, and an output, responsive to the signals at the first and second inputs, providing the condition signal only when the drive circuit control signal is at a level that disables the drive circuit;

a fault identification circuit, coupled to the output of the fault discriminating circuit including circuitry responsive to the condition signal provided by the fault discriminating circuit that provides a type signal indicative of a type of fault detected by the fault discriminating circuit, and a combinatorial circuit generating a binary-coded output signal having a first state when the drive circuit and the load are connected, a second state when the output terminal of the drive circuit is short-circuited to the ground reference, and a third state when the drive circuit and the load are disconnected.

2. The fault detection device of claim 1, wherein the circuitry responsive to the condition signal includes a current mirror having an input coupled to and controlled by the output terminal of the drive circuit and an output, responsive to the input, that provides a first signal if the load is disconnected and a second signal if the output terminal of the drive circuit is short-circuited to the ground reference.

3. The fault detection device of claim 2, wherein the voltage generator circuit comprises a resistive network.

4. The fault detection device of claim 3, further comprising a delay circuit, responsive to the drive control signal, to disable the output signal of the comparator for a predetermined time after the drive circuit control signal has disabled the drive circuit.

5. The fault detection device of claim 4, further comprising an inverter circuit coupling the drive circuit control signal to the second input of the AND circuit.

6. A fault detection device for a drive circuit having a control terminal that receives a control signal, an output terminal capable of establishing a connection to a load, and a third terminal coupled to a ground reference, the fault detection device comprising:

fault discriminating circuit means for determining when a fault exists in the connection between the drive circuit and the load, the fault discriminating circuit means having:

an input coupled to the output terminal of the drive circuit and an output providing a condition signal indicative of a condition of the connection between the drive circuit and the load when the drive circuit is disabled to prevent current from passing through the drive circuit;

a voltage generating means for generating a voltage representing the condition of the connection between the drive circuit and the load;

a comparator means, coupled to and responsive to the voltage generating means, for comparing the voltage generated by the voltage generating means with a reference voltage, and for providing an output signal, at least a portion of the voltage generating means and the comparator means forming a means for detecting a short circuit between the output terminal and the ground reference; and an AND circuit means having a first input responsive to the output signal of the comparator means and a second input, responsive to the drive circuit control signal, and an output, responsive to the signals at the first and second inputs, for providing the condition signal only when the drive circuit control signal is at a level that disables the drive circuit; and a fault identification circuit means, responsive to the condition signal, for providing a type signal indicative of a type of fault detected by the fault discriminating circuit means, including a combinatorial circuit means for generating a binary-coded output signal having a first state when the drive circuit and the load are connected, a second state when the output terminal of the drive circuit is short-circuited to the ground reference, and a third state when the drive circuit and the load are disconnected.

7. The fault detection device of claim 6, wherein the fault identification circuit means includes a current mirror circuit means, having an input coupled to and controlled by the output terminal of the drive circuit and an output responsive to the input, for providing a first signal if the load is disconnected and a second signal if the output terminal of the drive circuit is short-circuited to the ground reference.

8. The fault detection device of claim 7, further comprising a delay circuit means, responsive to the drive circuit control signal, for disabling the output signal of the comparator means for a predetermined time after the drive circuit control signal has disabled the drive circuit.

9. The fault detection device of claim 8, wherein the voltage generating means comprises a resistive network means for providing a voltage representing the condition of the connection between the drive circuit and the load.

10. A drive circuit, comprising:

a control element having an output terminal capable of establishing a connection to a load to supply a drive signal to the load, a control terminal that receives a drive circuit control signal, and a third terminal coupled to a reference potential;

a first fault discriminating circuit having an input coupled to the output terminal of the control element, a short-to-reference detector that detects a short circuit between the output terminal and the reference potential, an output providing a condition signal indicative of a condition of the connection between the control element and the load, and a detector for determining when a fault exists at the output terminal of the drive circuit; and a fault identification circuit, coupled to the output of the fault discriminating circuit, including circuitry, responsive to the condition signal provided by the fault discriminating circuit, that provides a type signal indicative of a type of fault detected by the fault discriminating circuit, wherein the fault identification circuit further comprises a combinatorial circuit that generates a binary-coded output signal having a first state when the control element and the load are connected, a second state when the output terminal of the control element is short-circuited to the reference potential, and a third state when the control element and the load are disconnected, wherein the fault identification circuit further includes a current mirror circuit having an input coupled to and controlled by the output terminal of the control element, and an output, responsive to the input, that provides a first signal if the load is disconnected and a second signal if the output terminal of the control element is short-circuited to the reference potential.

11. The drive circuit of claim 10, wherein the detector comprises a voltage generator for generating a voltage representing the condition of the connection between the control element and the load, and a comparator, coupled to and responsive to the voltage generated by the voltage generator, for comparing the voltage generated by the voltage generator with a reference voltage and for providing an output signal indicative of the condition of the connection between the control element and the load.

* * * * *